United States Patent
Berckmann et al.

(10) Patent No.: US 9,455,048 B2
(45) Date of Patent: Sep. 27, 2016

(54) NAND FLASH WORD LINE MANAGEMENT USING MULTIPLE FRAGMENT POOLS

(71) Applicant: SANDISK TECHNOLOGIES INC., Plano, TX (US)

(72) Inventors: Tucker Dean Berckmann, Palo Alto, CA (US); Talal Ahwal, Santa Cruz, CA (US); Damian Yurzola, San Jose, CA (US); Krishnamurthy Dhakshinamurthy, Bangalore (IN); Yong Peng, Milpitas, CA (US); Rajeev Nagabhirava, Santa Clara, CA (US); Arjun Hary, San Jose, CA (US); Tal Heller, Aloney Abba (IL); Yigal Eli, Petah Tikva (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 89 days.

(21) Appl. No.: 13/930,251

(22) Filed: Jun. 28, 2013

(65) Prior Publication Data

US 2015/0003156 A1   Jan. 1, 2015

(51) Int. Cl.
*G11C 29/04* (2006.01)
*G11C 16/10* (2006.01)
*G11C 29/00* (2006.01)
*G11C 16/04* (2006.01)

(52) U.S. Cl.
CPC ............ *G11C 29/04* (2013.01); *G11C 16/0483* (2013.01); *G11C 16/10* (2013.01); *G11C 29/82* (2013.01); *G11C 29/88* (2013.01)

(58) Field of Classification Search
CPC .................. G06F 12/0246; G06F 2212/7201; G11C 29/838; G11C 29/04; G11C 16/0483; G11C 29/82; G11C 29/88; G11C 16/10

USPC .......... 711/E12.008, E12.001; 714/710, 723; 365/189.09, 200

See application file for complete search history.

(56) References Cited

U.S. PATENT DOCUMENTS

| | | | |
|---|---|---|---|
| 7,774,392 B2 | 8/2010 | Lin | |
| 7,864,587 B2 * | 1/2011 | Roohparvar | 365/185.19 |
| 7,904,670 B2 | 3/2011 | Traister | |
| 8,040,744 B2 | 10/2011 | Gorobets | |
| 9,047,187 B2 * | 6/2015 | Guo et al. | |
| 2002/0126550 A1 * | 9/2002 | Sugio | 365/200 |

(Continued)

OTHER PUBLICATIONS

PCT International Search Report dated Oct. 21, 2014, PCT Patent Application PCT/US2014/042112.

(Continued)

*Primary Examiner* — Pho M Luu
*Assistant Examiner* — Jerome Leboeuf
(74) *Attorney, Agent, or Firm* — Vierra Magen Marcus LLP

(57) ABSTRACT

Systems and methods for improving NAND flash memory yields by identifying memory blocks with benign word line defects. Memory blocks including word line defects may be classified as incomplete memory blocks and may be used for storing data fragments. A data fragment may correspond with data written into memory cells associated with one or more contiguous word lines within a memory block that does not include a bad word line. In some cases, firmware associated with a NAND flash memory device may identify one or more data fragments based on the location of bad word lines within a memory block. A word line defect may be considered a benign defect if the defect does not prevent memory cells connected to other word lines within a memory block from being programmed and/or read reliably.

20 Claims, 15 Drawing Sheets

(56) References Cited

U.S. PATENT DOCUMENTS

| | | |
|---|---|---|
| 2005/0141312 A1 | 6/2005 | Sinclair |
| 2006/0107127 A1 | 5/2006 | Park |
| 2006/0256629 A1 | 11/2006 | Roohparvar |
| 2008/0091988 A1* | 4/2008 | Yoel et al. .................. 714/711 |
| 2008/0270681 A1* | 10/2008 | Van Acht et al. ............ 711/103 |
| 2010/0074024 A1* | 3/2010 | Roohparvar ............. 365/185.19 |
| 2010/0174847 A1* | 7/2010 | Paley et al. .................. 711/103 |
| 2011/0161560 A1 | 6/2011 | Hutchison |
| 2012/0008405 A1 | 1/2012 | Shah |
| 2012/0060054 A1 | 3/2012 | Sun |
| 2012/0284469 A1 | 11/2012 | Seo |
| 2013/0151752 A1* | 6/2013 | Hsiao .................. G06F 11/1048 711/103 |
| 2014/0310448 A1* | 10/2014 | Nam .................. G11C 11/5628 711/103 |

OTHER PUBLICATIONS

PCT Written Opinion of the International Searching Authority dated Oct. 21, 2014, PCT Patent Application PCT/US2014/042112.

* cited by examiner

9,455,048 B2

NAND FLASH WORD LINE MANAGEMENT USING MULTIPLE FRAGMENT POOLS

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased difficulty with manufacturing defects, such as word line defects.

DETAILED DESCRIPTION

Figure 1A:
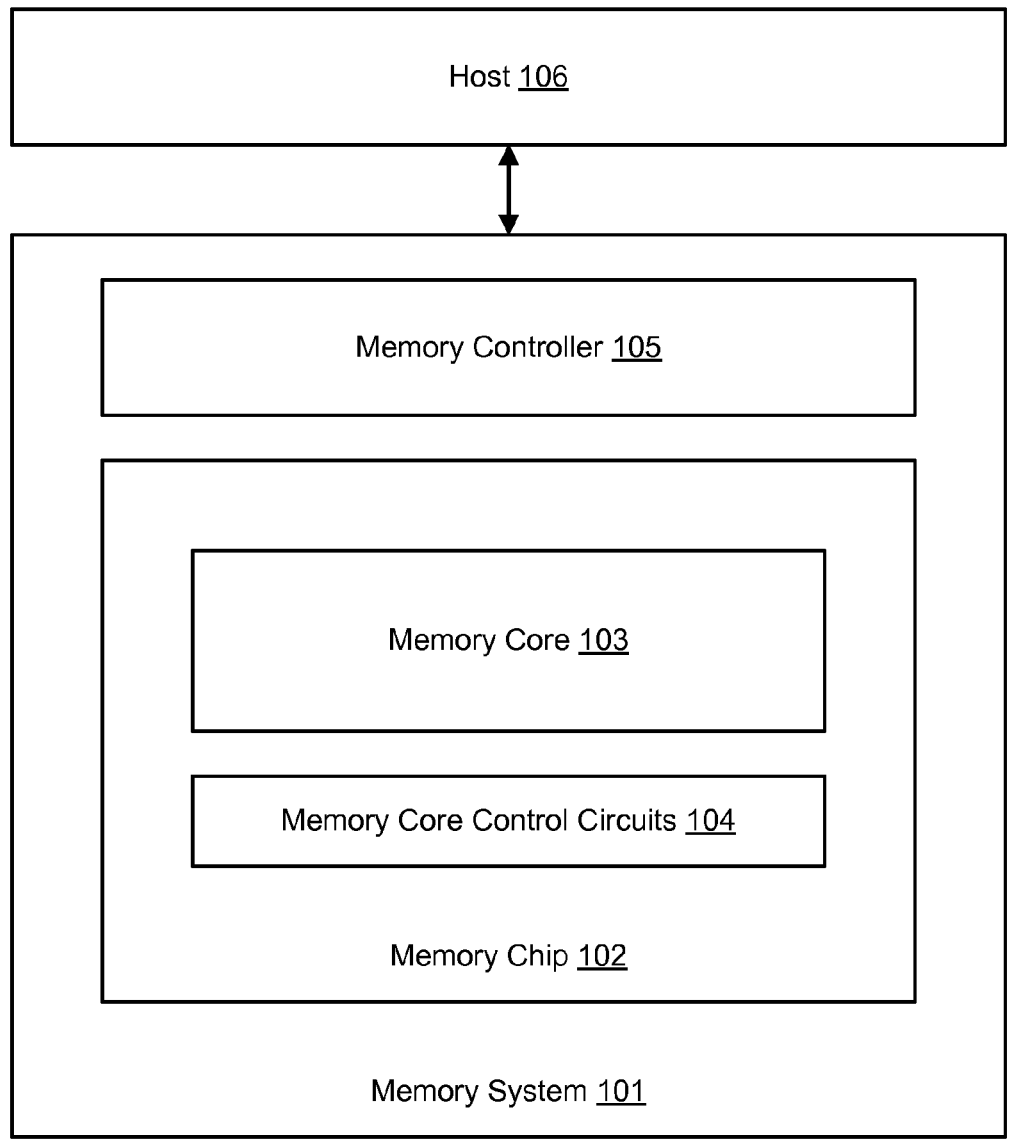
FIG. 1A depicts one embodiment of a memory system and a host.

Technology is described for improving NAND flash memory yields and/or extending NAND flash product lifetimes by identifying memory blocks with benign word line defects, mapping the memory blocks with word line defects to binary cache blocks (or other types of single-level cell memory blocks), tracking the word line defects using a bad word line list, and writing to the binary cache blocks using the bad word line list to avoid defective word lines and/or word lines corresponding with defective memory cells. Memory blocks including benign word line defects may be classified as incomplete memory blocks and may be used for storing data fragments. A data fragment may correspond with data written into memory cells associated with one or more contiguous word lines within a memory block that does not include a bad word line. In some cases, firmware associated with a NAND flash memory device may identify one or more data fragments based on the location of bad word lines within a memory block. A word line defect may be considered a benign defect if the defect does not prevent memory cells connected to other word lines within a memory block from being programmed and/or read reliably.

In some embodiments, the word line defects may be initial defects that are formed during manufacturing of a NAND flash memory (e.g., word line short or open defects). In this case, benign word line defects may be identified during testing and sorting of NAND flash die (e.g., during wafer sort or die sort) and an identification of incomplete memory blocks and corresponding bad word lines may be written to a bad word line list stored in a reserved memory partition. The reserved memory partition may store other memory specific information such as the number of initial bad blocks and a device serial number. In some cases, the reserved memory partition may comprise a read-only memory that is programmed during testing of NAND flash memory devices or prior to shipment of the NAND flash memory devices to customers. Memory blocks that fail for other reasons (e.g., hard shorts that prevent the appropriate biasing of word line voltages, power-ground shorts, or the number of initial defects is greater than a threshold) may be added to a bad block list that prevents the memory blocks from being enabled or used for storing data.

In some embodiments, the word line defects may comprise acquired or grown defects that occur after a memory device has been manufactured. For example, memory cell characteristics of memory cells corresponding with a word line may shift or change over time as a function of the number of times that the memory cells are erased and reprogrammed. To account for memory cell and memory block failures that occur during operation of a memory device, the memory device may include a number of spare blocks (or extra blocks). The spare blocks may be used as binary cache blocks, update blocks, or multi-level cell (MLC) blocks. An update block may be used as an initial storage location for data to be written to a NAND flash memory device. An update block may comprise a sequential update block (i.e., where data is managed sequentially) or a non-sequential update block (i.e., a chaotic update block). Spare blocks may be mapped as either single-level cell (SLC) blocks or MLC blocks. In some embodiments, when a word line related failure occurs to an MLC block during operation of a memory device, the defective MLC block may be swapped for a defect-free memory block. The defect-free memory block may comprise a spare block or a memory block used as a binary cache block. In one example, a defect-free binary cache block may be swapped for a defective MLC block.

FIG. 1A depicts one embodiment of a memory system 101 and a host 106. The host 106 may comprise a computing device (e.g., a personal computer, audio player, digital camera, or mobile computing device) or a storage device (e.g., an enterprise storage device). The memory system 101 may comprise a memory card, a flash drive, a system on a chip (SOC), or an embedded memory system. As depicted, the memory system 101 includes a memory controller 105 and a memory chip 102. In some cases, a memory system, such as memory system 101, may include more than one memory chip. The memory controller 105 may include one or more state machines, control logic, page registers, non-volatile memory, SRAM, or other circuitry for controlling the operation of memory chip 102. The one or more state machines, control logic, page registers, non-volatile memory, SRAM, and/or other circuitry for controlling the operation of the memory chip 102 may be referred to as managing or control circuits. The managing or control circuits may be used to facilitate one or more memory array operations associated with the memory chip 102 including erasing, programming, and reading operations. The memory controller 105 may receive data and commands from host 106 and provide memory chip data to host 106. In some embodiments, the memory controller 105 and memory chip 102 may be arranged on a single integrated circuit. In other embodiments, memory controller 105 and memory chip 102 may be arranged on different integrated circuits.

As depicted, the memory chip 102 includes memory core control circuits 104 and memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. The memory cells may comprise floating-gate transistors or non-volatile memory technologies that employ charge trapping, phase-change (e.g., chalcogenide materials), or state-change materials. In one embodiment, the memory core control circuits 104 and memory core 103 are arranged on a single integrated circuit. In other embodiments, the memory core control circuits 104 and memory core 103 may be arranged on different integrated circuits.

Referring to FIG. 1A, a memory system operation may be initiated when host 106 sends instructions to memory controller 105 indicating that it would like to read data from memory system 101 or write data to memory system 101. In the event of a write (or programming) operation, host 106 may send to memory controller 105 both a write command and the data to be written. The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested. Once a read or write operation is initiated by memory controller 105, memory core control circuits 104 may generate the appropriate bias voltages for word lines and bit lines within memory core 103, as well as generate the appropriate memory block, row, and column addresses. The memory controller 105 may manage the translation (or mapping) of logical addresses received from the host 106 into physical addresses associated with the memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may comprise a plurality of memory blocks. A memory block may comprise a group of memory cells that are erased concurrently (i.e., a unit of erase). In some cases, the group of memory cells may comprise a binary cache or a group of multi-level cells for storing user data. Each of the plurality of memory blocks may include a plurality of pages. A page may comprise a group of memory cells that may be accessed, programmed, and/or read concurrently. The group of memory cells within a page may share a common word line. In some cases, a memory block may comprise 32, 64, or 128 pages and each page may comprise 2 KB or 4 KB of data.

Figure 1B:
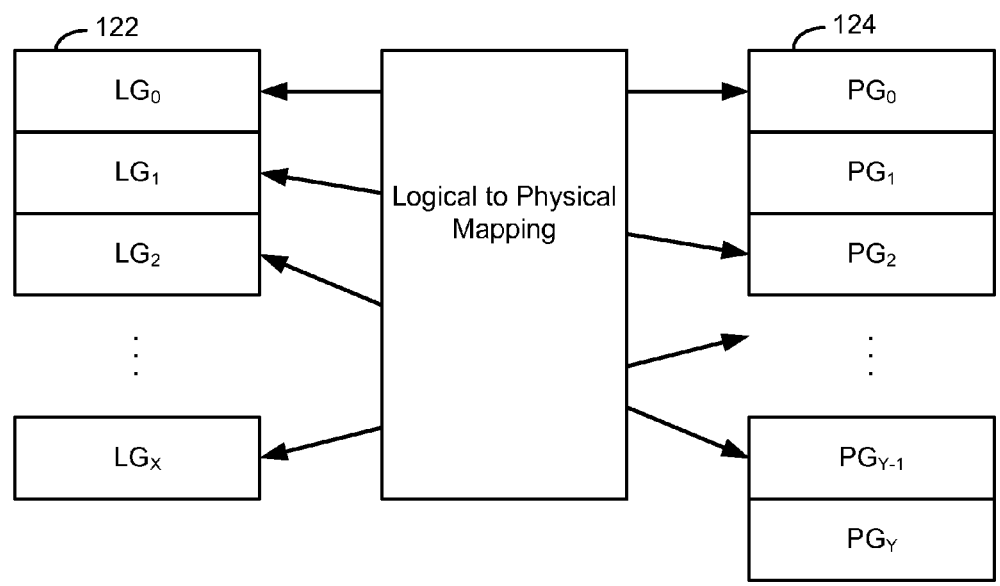
FIG. 1B depicts one embodiment of a mapping between logical groups and physical groups as performed by a memory system.

FIG. 1B depicts one embodiment of a mapping between logical groups and physical groups as performed by a memory system, such as memory system 101 in FIG. 1A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page. In some cases, a logical group may comprise a grouping of one or more logical sectors which are mapped to a metablock. The logical to physical mapping between the logical groups and the physical groups may be stored in a table or list within a non-volatile memory, such as memory core 103 in FIG. 1A. In some cases, each logical group may be mapped to a metablock address. In one embodiment, a Group Address Table (GAT) may be used to store a mapping of metablock addresses for each logical group within a memory system.

Figure 1C:
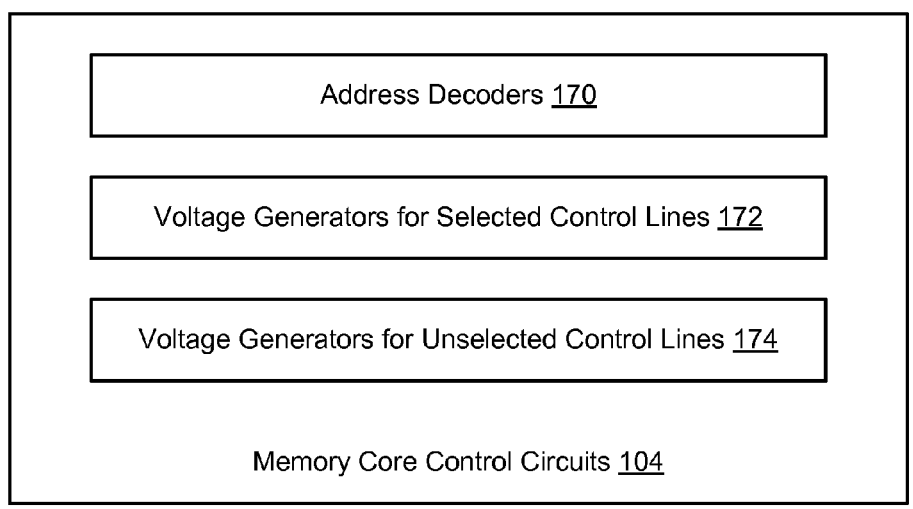
FIG. 1C depicts one embodiment of memory core control circuits.

FIG. 1C depicts one embodiment of memory core control circuits 104 in FIG. 1A. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1D:
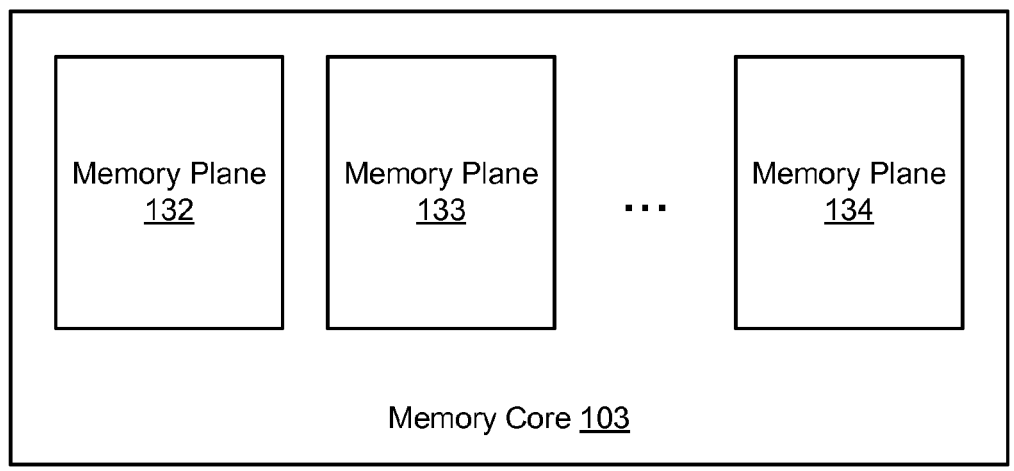
FIG. 1D depicts one embodiment of memory core.

FIG. 1D depicts one embodiment of memory core 103 in FIG. 1A. As depicted, memory core 103 includes memory planes 132-134. In some embodiments, the number of memory planes (or bays) per memory core can be different for different implementations. For example, a memory core may include only a single memory plane or a plurality of memory plane (e.g., 16 memory bays). Each memory plane may comprise one or more memory blocks. Each memory block may comprise one or more memory cells. In some cases, multiple memory planes may be operated in parallel to increase read and/or write bandwidth. Although a memory core organization is depicted where memory planes comprise memory blocks, and memory blocks comprise a group of memory cells, other organizations or groupings can also be used with the technology described herein.

Figure 1E:
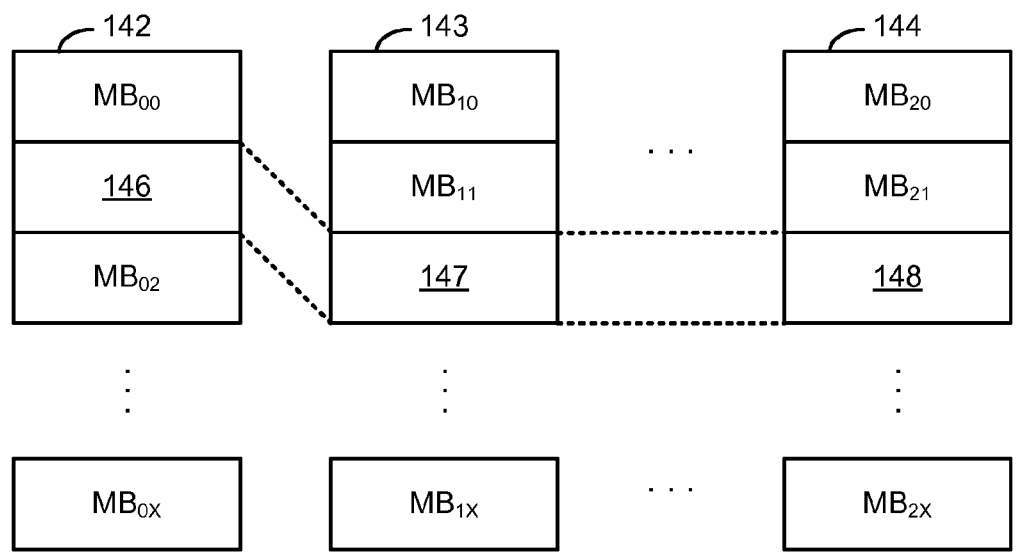
FIG. 1E depicts one embodiment of a memory core organization including a plurality of memory planes.

FIG. 1E depicts one embodiment of a memory core organization including a plurality of memory planes. The memory planes 142-144 each comprise a plurality of physical groups. Each physical group may comprise a memory block (e.g., memory block MB$_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes. For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

Figure 2A:
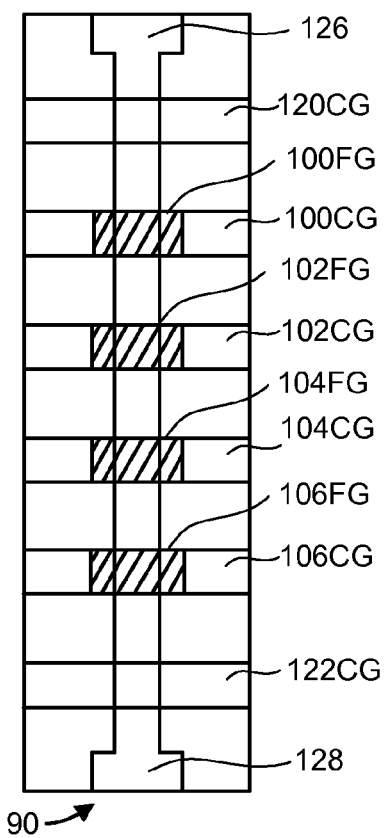
FIG. 2A depicts one embodiment of a NAND string.
Figure 2B:
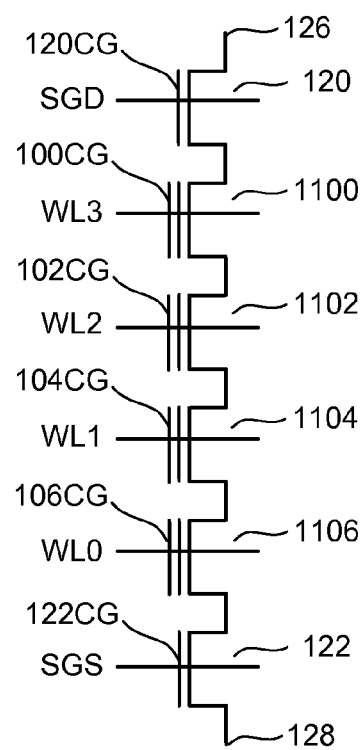
FIG. 2B depicts one embodiment of the NAND string of FIG. 2A using a corresponding circuit diagram.

FIG. 2A depicts one embodiment of a NAND string 90. FIG. 2B depicts one embodiment of the NAND string of FIG. 2A using a corresponding circuit diagram. As depicted, NAND string 90 includes four transistors, 1100, 1102, 1104, and 1106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2B). Select gate 122 is controlled by applying the appropriate voltage to control gate 122CG (i.e., via select line SGS of FIG. 2B). Each of the transistors 1100, 1102, 1104, and 1106 includes a control gate and a floating gate. For example, transistor 1100 includes control gate 100CG and floating gate 100FG, transistor 1102 includes control gate 102CG and floating gate 102FG, transistor 1104 includes control gate 104CG and floating gate 104FG, and transistor 1106 includes control gate 106CG and floating gate 106FG. Control gates 100CG, 102CG, 104CG, and 106CG are connected to word lines WL3, WL2, WL1, and WL0, respectively.

Note that although FIGS. 2A and 2B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
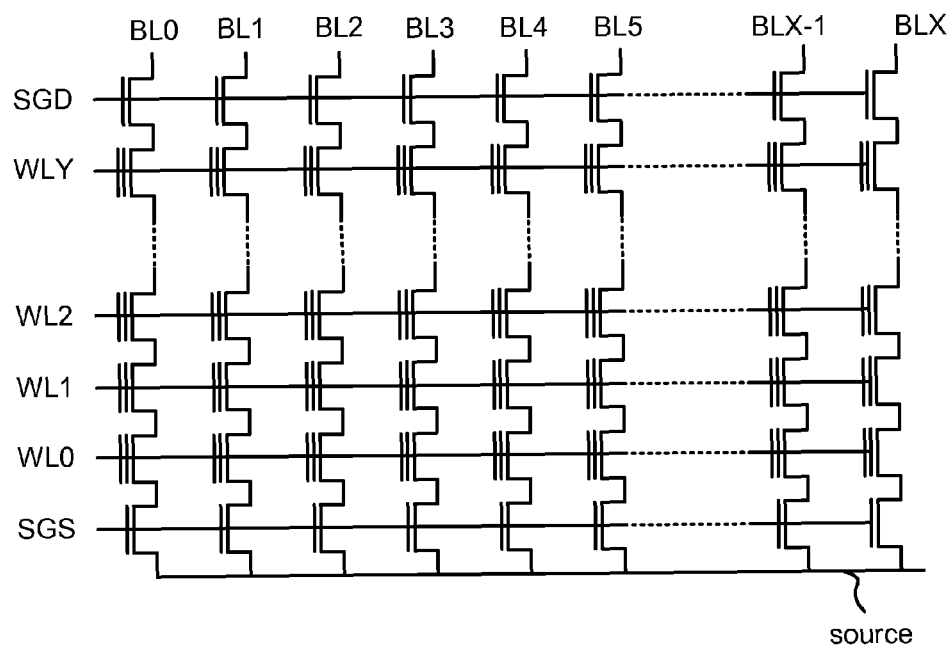
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

One benefit of a shared bit line string architecture (e.g., a shared bit line string architecture comprising NAND flash memory cells or SONOS memory cells) is that it relieves the bit line pitch by 2× since pairing strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. These benefits, however, come at the expense of reduced controllability of each string. For example, during a programming operation only one string of a pair of strings may be programmed via the common bit line at a particular time. More information regarding a shared bit line memory architecture using NAND flash memory cells may be found in U.S. Provisional Application 61/561,286, "Improved Operation for Non-Volatile Storage System With Shared Bit Lines Connected to Single Selection Device," U.S. Provisional Application 61/422,385, "Non-Volatile Storage System With Shared Bit Lines Connected to Single Selection Device," and U.S. patent application Ser. No. 13/429,851, "Shared-Bit-Line Bit Line Setup Scheme," all of which are herein incorporated by reference in their entirety.

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
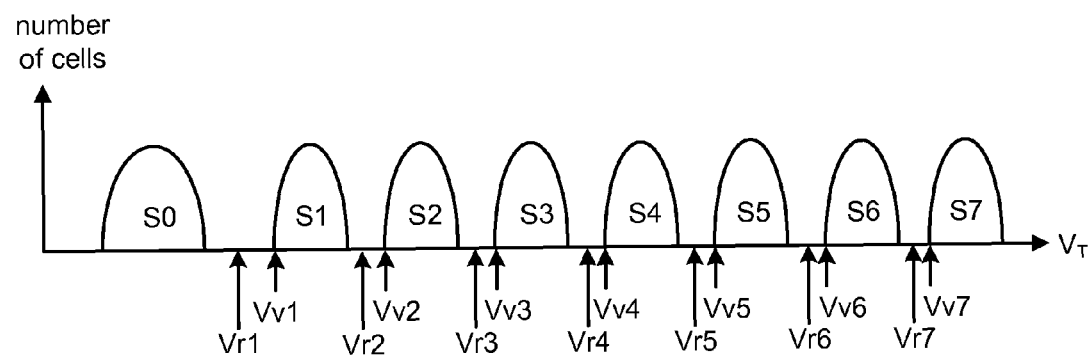
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4:
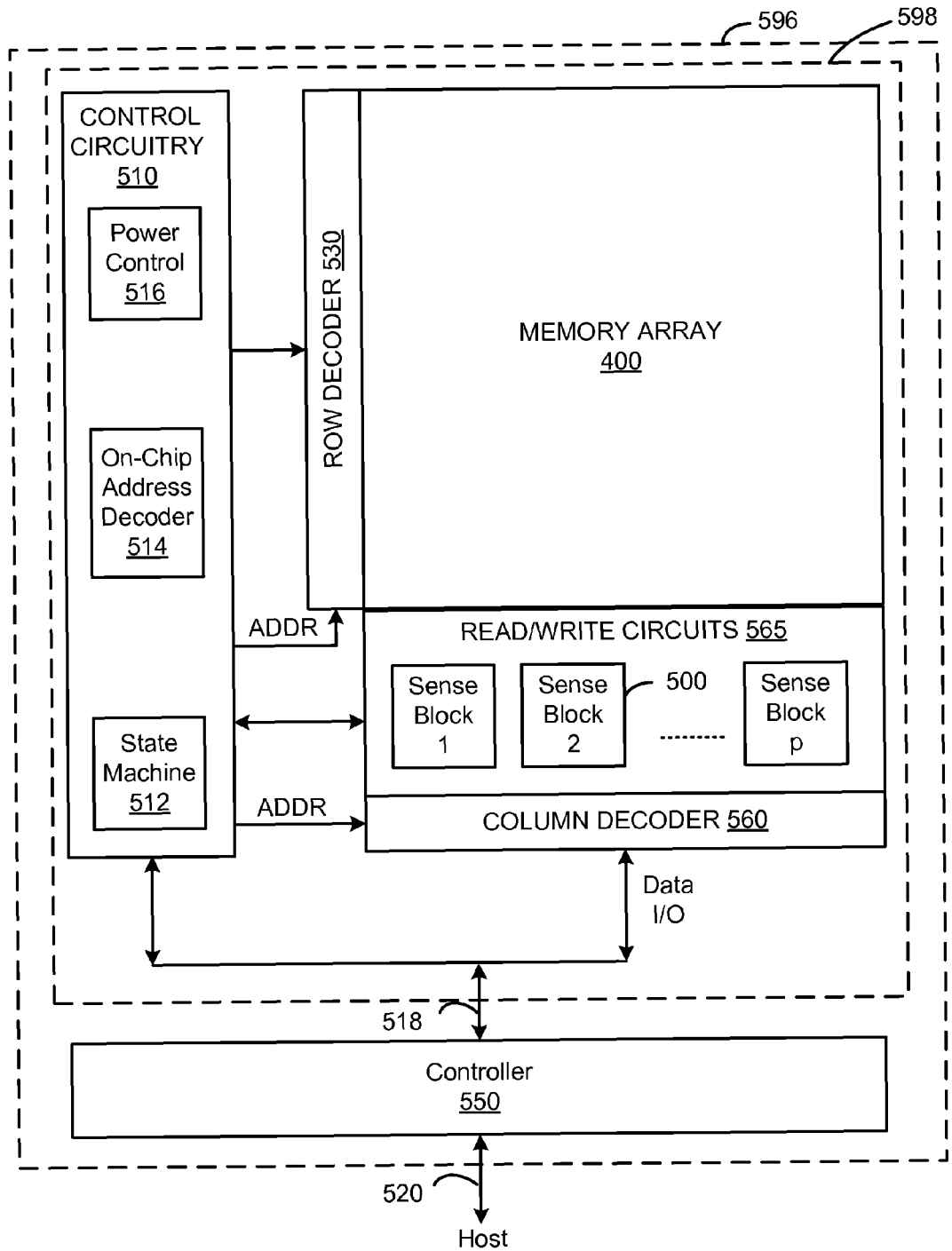
FIG. 4 depicts one embodiment of a non-volatile storage system.

FIG. 4 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5:
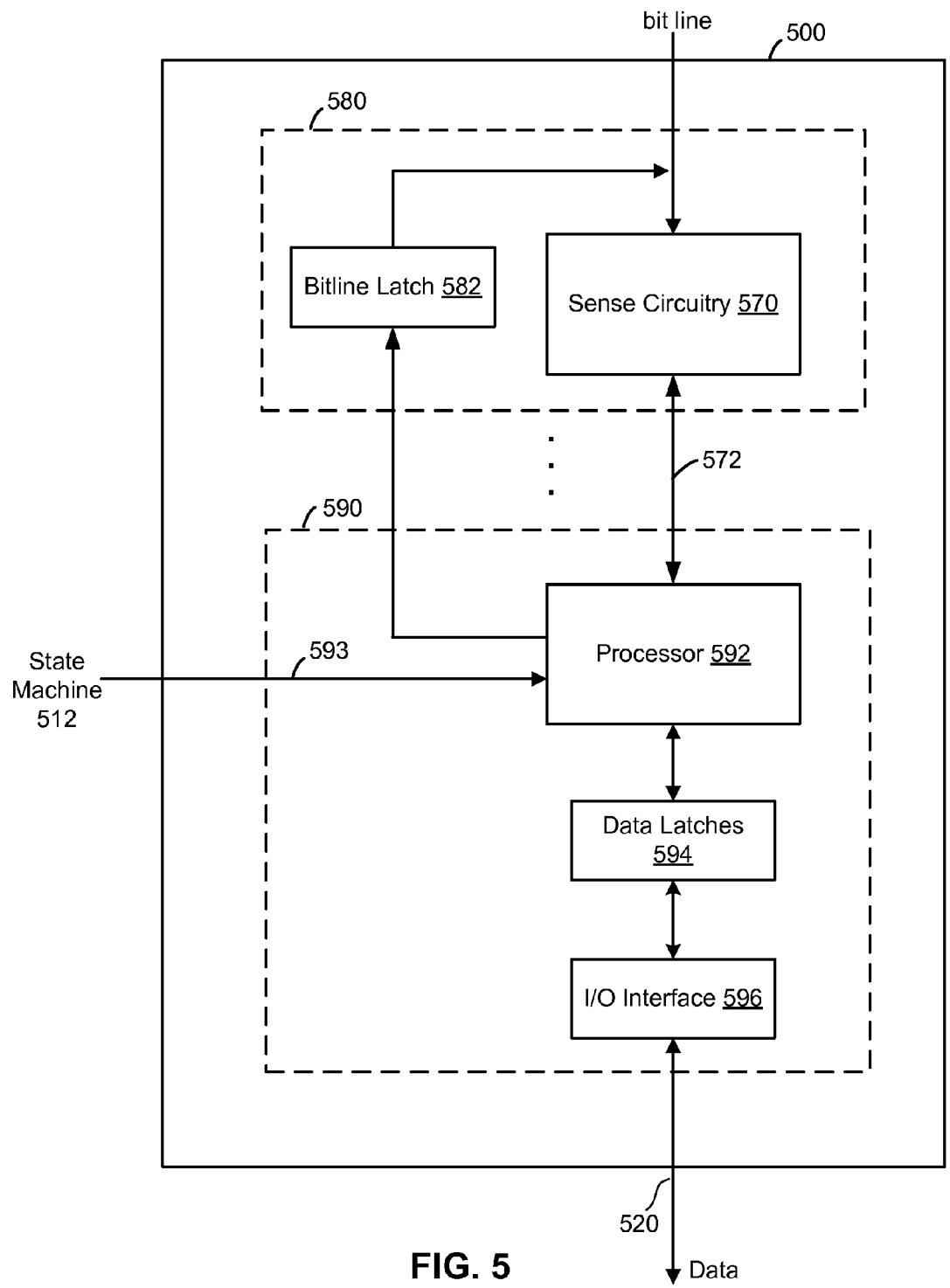
FIG. 5 depicts one embodiment of a sense block.

FIG. 5 depicts one embodiment of a sense block 500, such as sense block 500 in FIG. 4. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 4. I/O interface 596 provides an interface between data latches 594 and the data bus 520.

During a read operation or other storage element sensing operation, a state machine, such as state machine 512 in FIG. 4, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
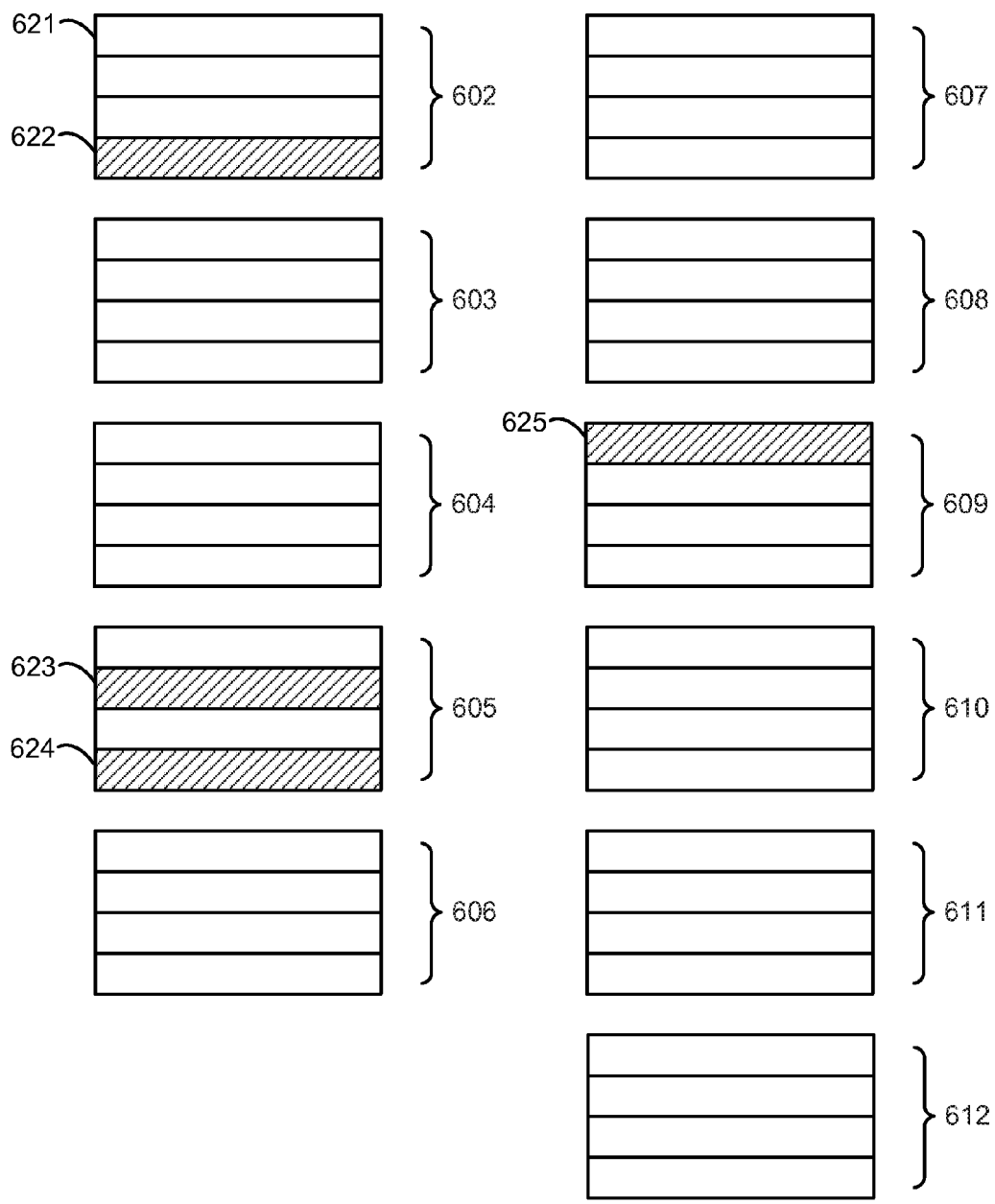
FIG. 6A depicts one embodiment of a set of memory blocks belonging to a memory plane.

FIG. 6A depicts one embodiment of a set of memory blocks 602-612 belonging to a memory plane, such as memory plane 132 and FIG. 1D. As depicted, memory block 602 includes a word line defect 622, memory block 605 includes word line defects 623-624, and memory block 609 includes word line defect 625. The memory blocks 603-604, 606-608, and 610-612 do not include word line defects.

Figure 6B:
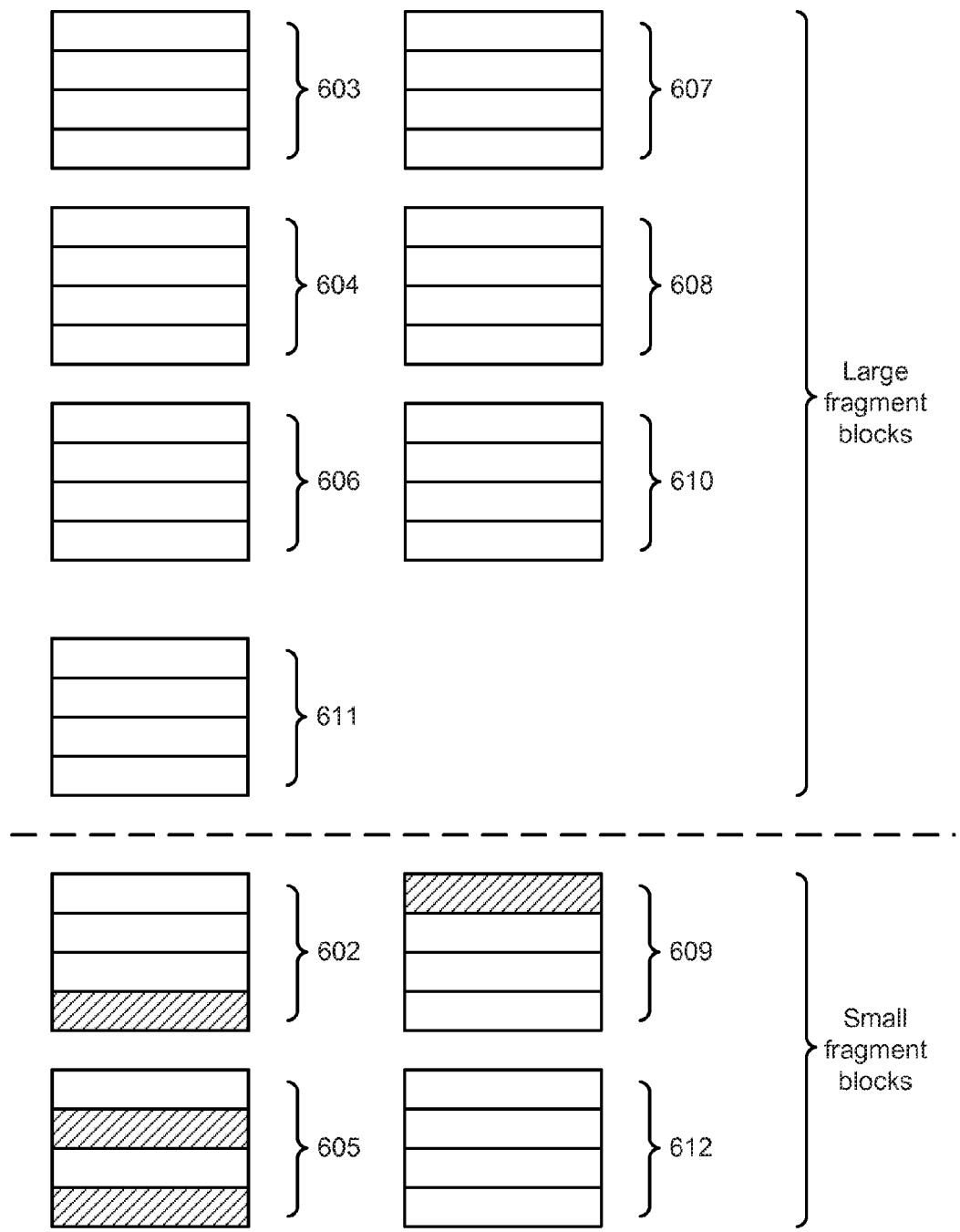
FIG. 6B depicts one embodiment of the set of memory blocks of FIG. 6A partitioned into large fragment blocks and small fragment blocks.

FIG. 6B depicts one embodiment of the set of memory blocks 602-612 of FIG. 6A partitioned into large fragment blocks and small fragment blocks. A large fragment block may comprise a memory block that does not include a word line defect or a memory block in which the data stored cannot be split into or stored as a plurality of data fragments within the large fragment block. A small fragment block may comprise a memory block that includes at least one word line defect and may be used to store data that can be split into or stored as one or more data fragments. In some embodiments, a pool of large fragment blocks may be assigned as MLC blocks and/or update blocks and a pool of small fragment blocks may be assigned as binary blocks (or SLC blocks). As depicted, memory blocks 603-604, 606-608, and 610-611 have been mapped to a large segment block pool and memory blocks 602, 605, 609, and 612 have been mapped to a small fragment block pool. In one embodiment, the memory blocks allocated as small fragment blocks may comprise a binary cache. The size of the binary cache may be fixed over time or may be reduced over time as memory blocks allocated to the binary cache pool are removed from the binary cache pool (e.g., due to grown defects in a memory block). In some cases, a large fragment block may comprise a first MLC block or a first SLC block and a small fragment block may comprise a second MLC block or a second SLC block. In some cases, memory blocks allocated to a large fragment block pool may be mapped to MLC blocks and memory blocks allocated to a small fragment block pool may be mapped to binary cache blocks.

Figure 6C:
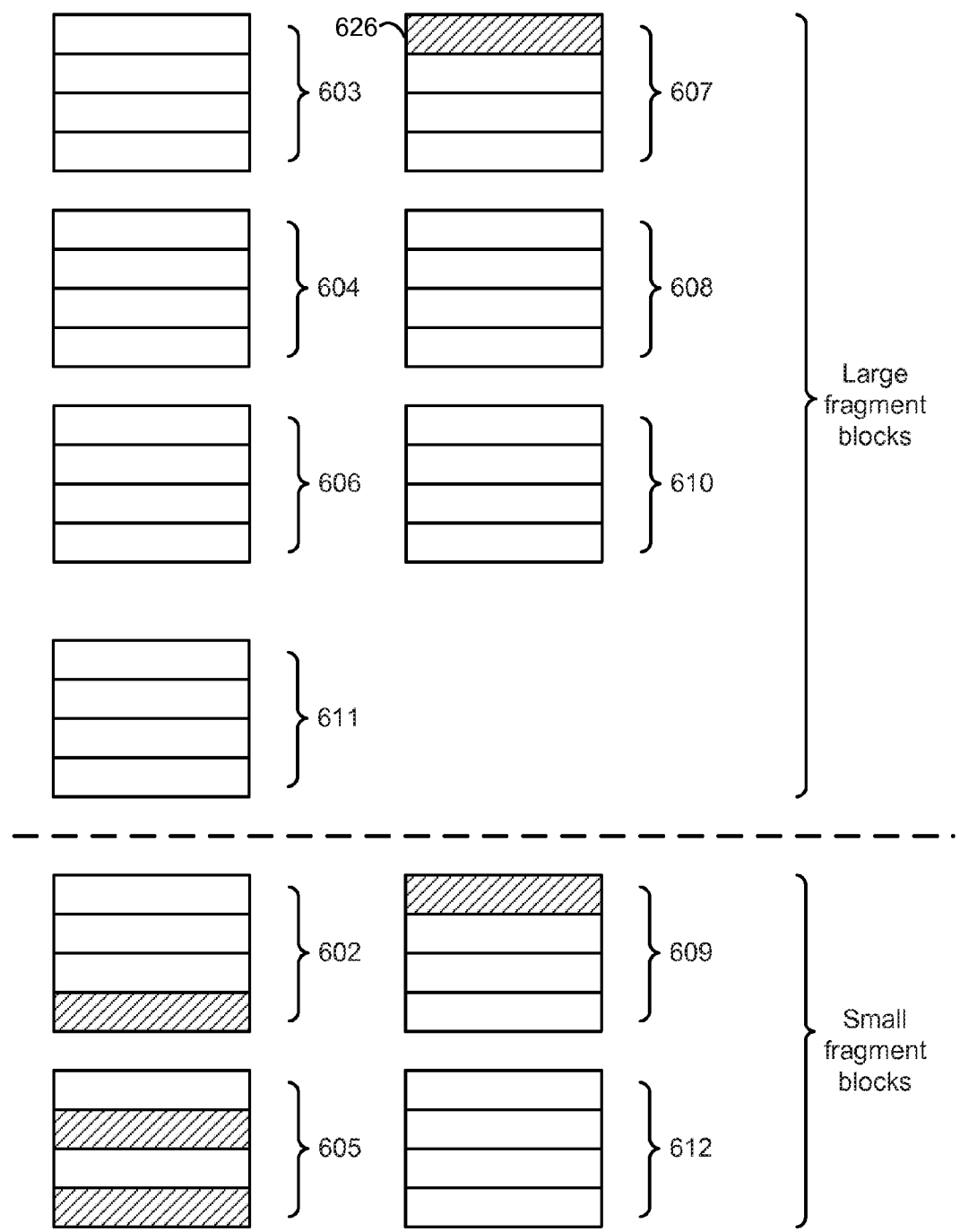
FIG. 6C depicts one embodiment of the set of memory blocks of FIG. 6A wherein a grown word line defect has occurred.

FIG. 6C depicts one embodiment of the set of memory blocks 602-612 of FIG. 6A wherein a grown word line defect 626 has occurred in memory block 607. In one embodiment, when a grown word line defect occurs to a large segment memory block, such as memory block 607, the memory block may be added to a bad block list and removed from the memory blocks that are used for storing data. However, if the grown word line defect comprises a benign word line defect (i.e., a word line defect that does not prevent the memory block from being used as a small segment memory block), then the memory block may be allocated to a small fragment block pool. In some cases, a spare block may be used to replace the memory block removed from the large segment block pool (e.g., a spare block may be used to replace defective memory block 607). In other embodiments, a small fragment block may be used to replace the memory block removed from the large segment block pool (e.g., a defect-free memory block within a small fragment block pool may be used to replace defective memory block 607).

Figure 6D:
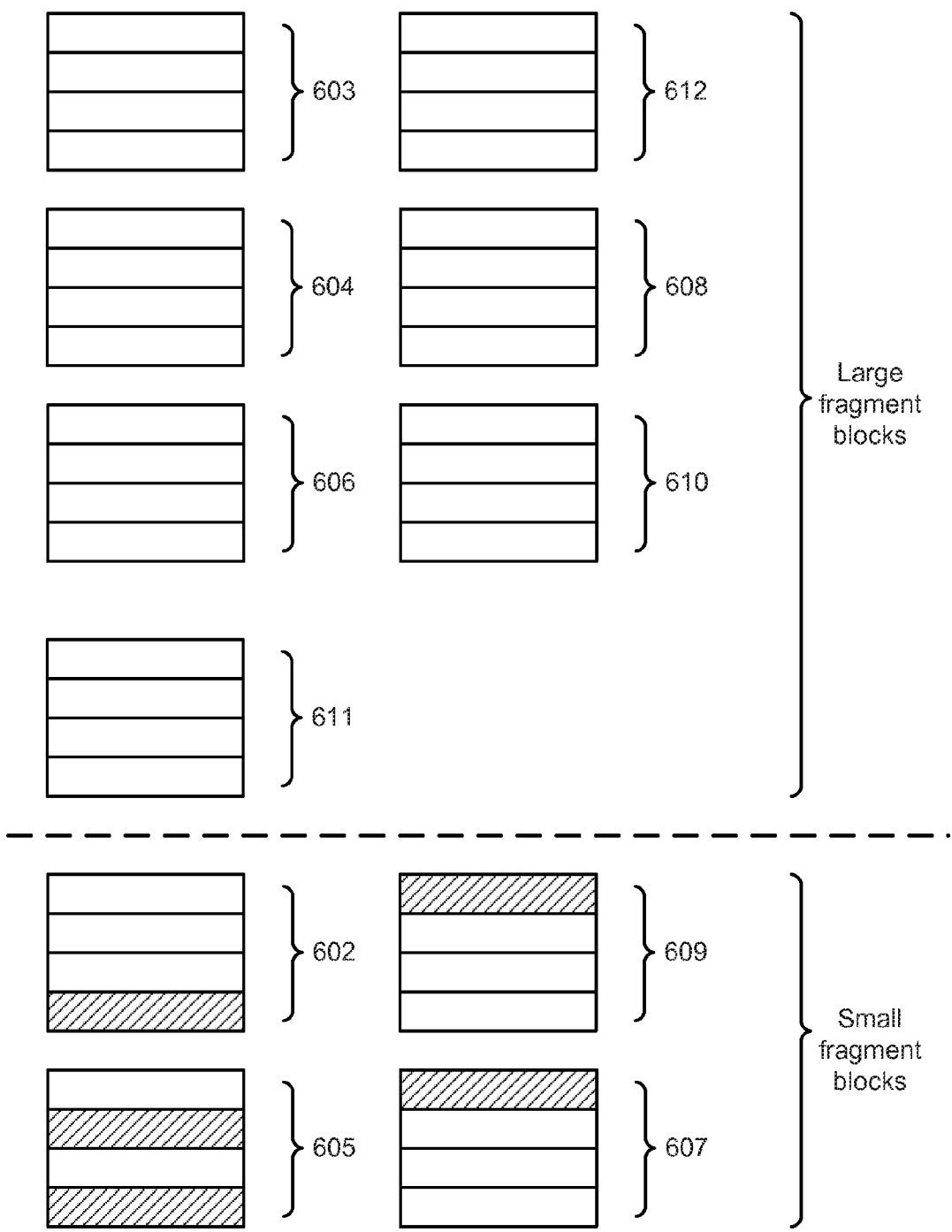
FIG. 6D depicts one embodiment of the set of memory blocks of FIG. 6A wherein a defect-free memory block has been swapped with a defective memory block.

FIG. 6D depicts one embodiment of the set of memory blocks 602-612 of FIG. 6A wherein the defect-free memory block 612 has been swapped with defective memory block 607. In some embodiments, a grown word line defect may be tested to ensure that the defect is benign before mapping a memory block including the word line defect as a small fragment block (e.g., before mapping defective memory block 607 as a binary cache block). In one example, a test program sequence may be performed on the defective memory block wherein one or more test patterns are programmed into memory cells associated with non-defective word lines of the defective memory block and then verified over a range of read conditions. The granularity of data fragments within a small fragment block may allow firmware to map data fragments around benign word line defects. In some cases, the data fragments may be positioned between benign word line defects or between neighboring word lines of benign word line defects (i.e., when a word line defect occurs both the defective word line and its neighboring word lines may be removed as usable word lines within a memory block). In one embodiment, by swapping a defect-free small fragment block (e.g., a binary cache block) with a defective large segment block (e.g., an MLC memory block including a word line defect) spare blocks may be conserved. In some embodiments, spare blocks from a spare block pool may be used to replace defective large fragment blocks; however, once the spare block pool has been exhausted, then defect-free memory blocks from the small fragment pool (e.g., a binary cache pool) may be used to replace defective large fragment blocks.

Figure 6E:
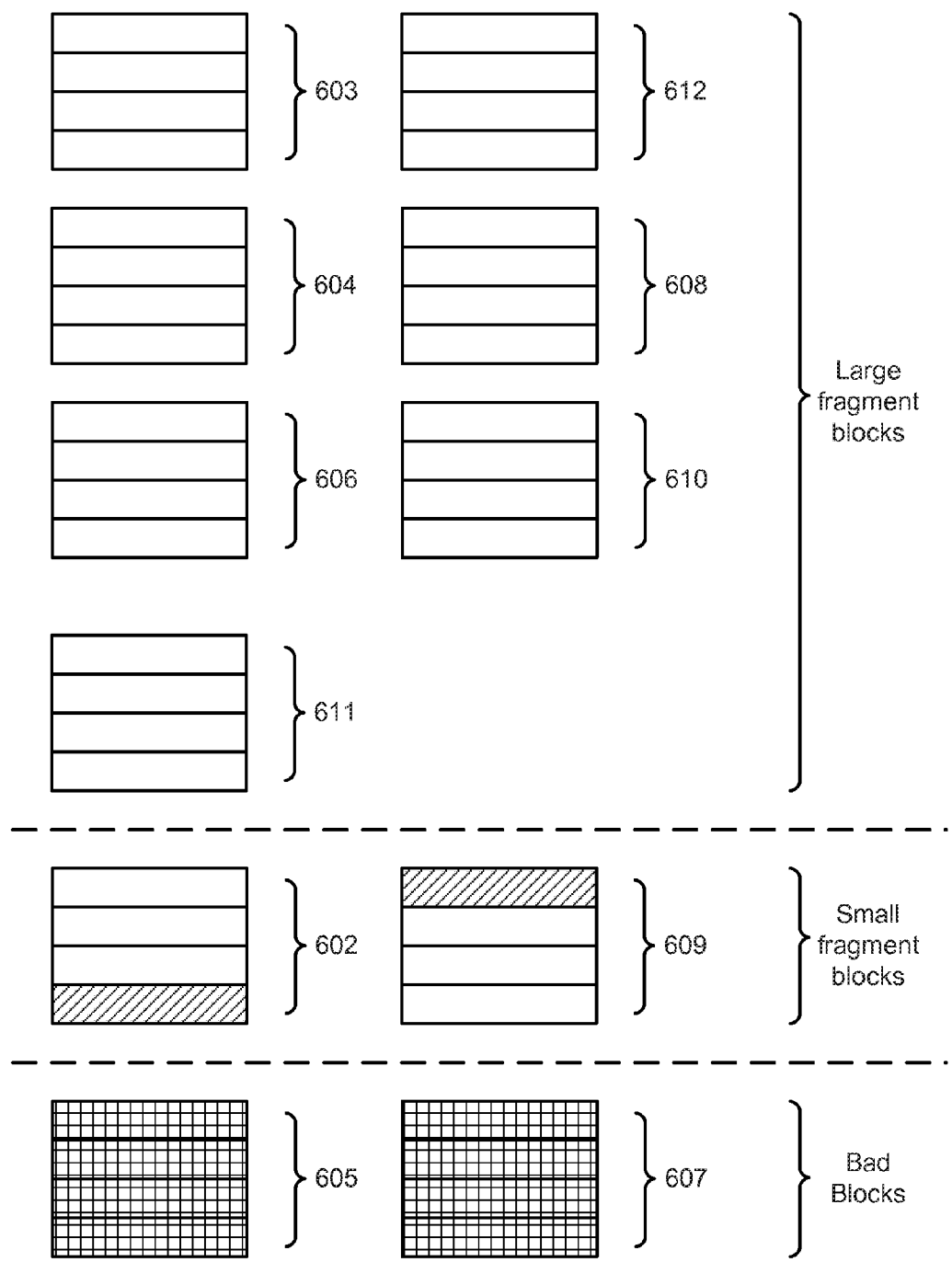
FIG. 6E depicts one embodiment of the set of memory blocks of FIG. 6A wherein additional grown defects have caused memory blocks to become unusable.

FIG. 6E depicts one embodiment of the set of memory blocks 602-612 of FIG. 6A wherein additional grown defects have caused memory blocks 605 and 607 to become unusable as small fragment blocks. As depicted, memory blocks 605 and 607 have been added to the bad block list and have been removed from the small fragment block pool. In some cases, if small fragment blocks are used as a binary cache, then the size of the binary cache may be reduced as memory blocks within the binary cache become defective. The reduction in the size of the binary cache may impact read and/or write performance. In some cases, spare blocks from a spare block pool may be used to replace defective memory blocks within the binary cache.

Figure 7A:
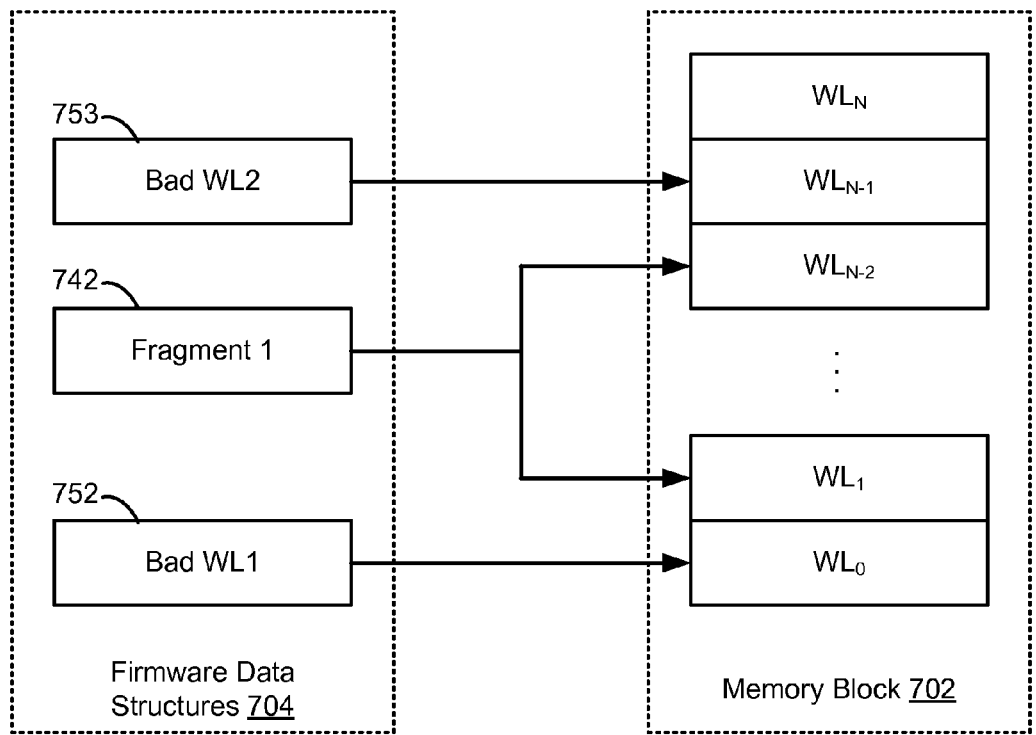
FIG. 7A depicts one embodiment of firmware data structures used during a programming operation applied to a memory block.

FIG. 7A depicts one embodiment of firmware data structures used during a programming operation applied to memory block 702. As depicted, the firmware data structures 704 include bad word line pointers 752-753 and data fragment pointer 742. The bad word line pointers 752-753 may be associated with a bad word line list corresponding with memory block 702. The data fragment pointer 742 may comprise a pointer to a plurality of word lines within memory block 702. In one embodiment, the data fragment pointer 742 may comprise an identification of a starting word line and an ending word line for a particular data fragment. The firmware data structures 704 allow data to be sequentially programmed to a data fragment associated with the data fragment pointer 742 without writing to memory cells associated with defective word lines.

Figure 7B:
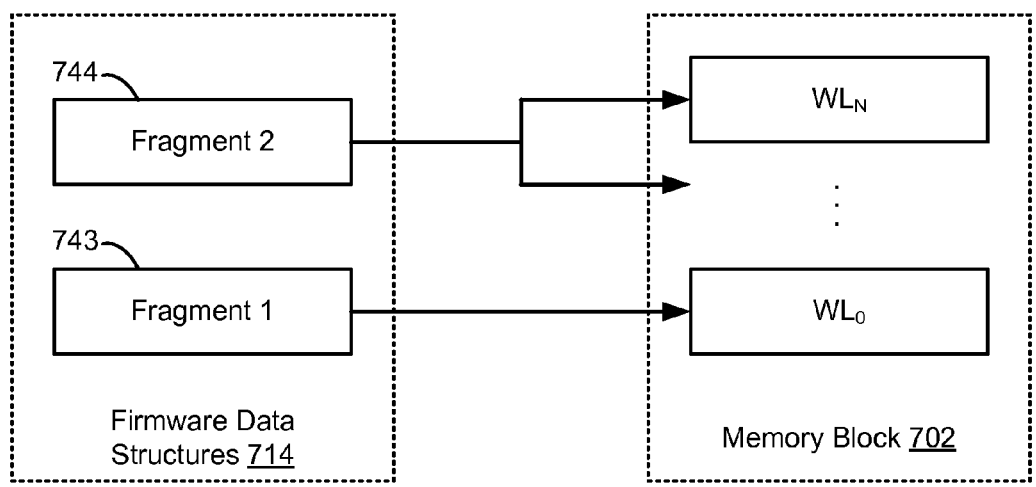
FIG. 7B depicts one embodiment of firmware data structures used during a read operation applied to a memory block.

FIG. 7B depicts one embodiment of firmware data structures used during a read operation applied to memory block 702. As depicted, the firmware data structures 714 include data fragment pointers 743-744. During a read operation, the data fragments stored within memory block 702 have been written such that each data fragment does not include a defective word line. Therefore, during a read operation information regarding the location of defective word lines within an incomplete memory block is not necessary for reading data from each of the data fragments.

Figure 8A:
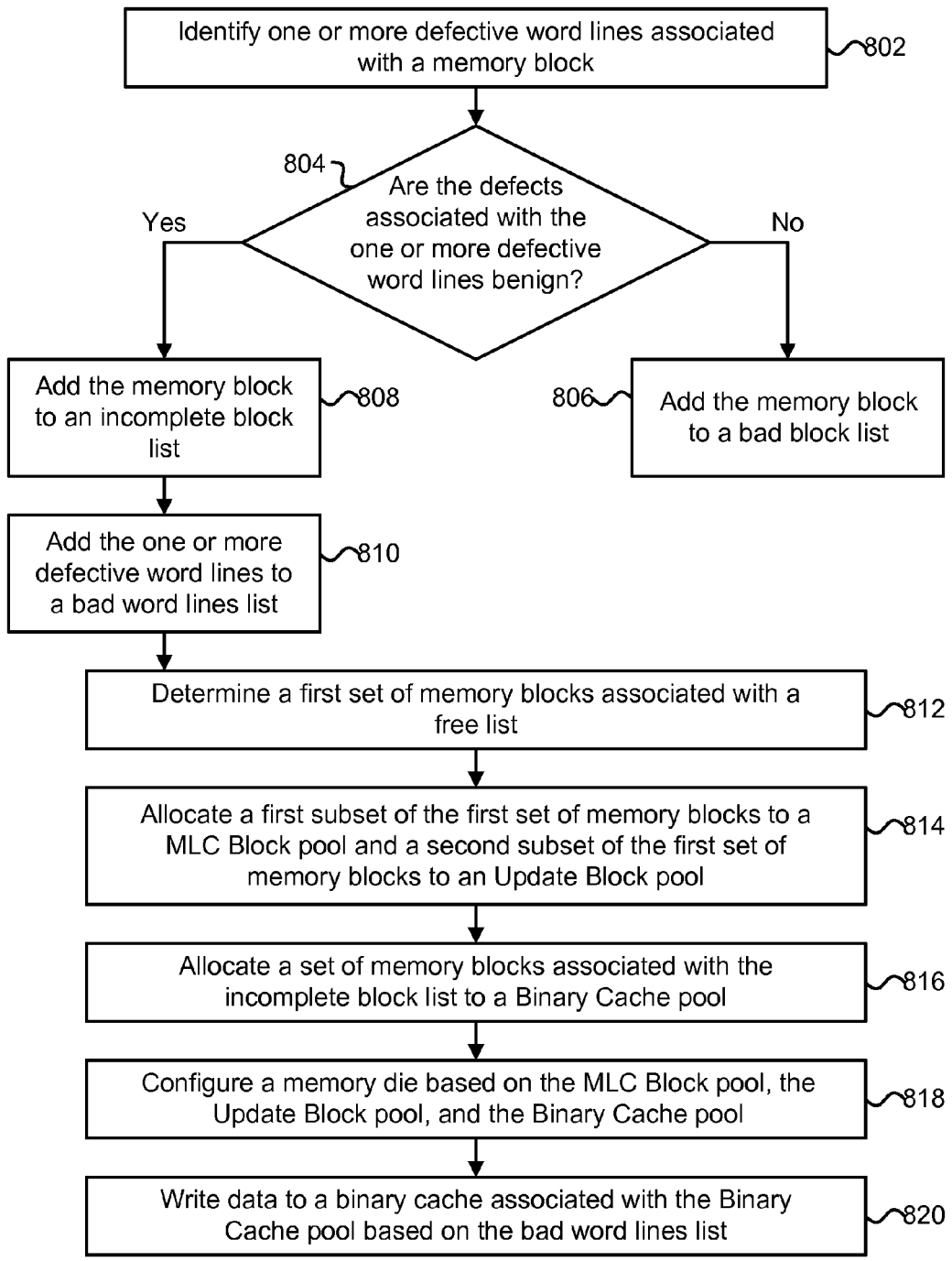
FIG. 8A is a flowchart describing one embodiment of a process for programming a memory block.

FIG. 8A is a flowchart describing one embodiment of a process for programming a memory block. In one embodiment, the process of FIG. 8A may be performed by a non-volatile storage system, such as non-volatile storage system 596 in FIG. 4.

In step 802, one or more defective word lines associated with a memory block are identified. The one or more defective word lines may be identified during testing or sorting of a memory die including the memory block. In one embodiment, the one or more defective word lines may be identified by programming a test pattern into memory cells corresponding with each word line within a memory block and reading back the test pattern over margined read conditions to verify the test pattern.

In step 804, it is determined whether the defects associated with the one or more defective word lines are benign. A word line defect may be considered a benign defect if the defect does not prevent memory cells connected to other word lines within a memory block from being programmed and/or read reliably. In one example, a word line defect associated with a particular word line (e.g., WL0 in FIG. 3A) may be deemed a benign defect if memory cells connected to one or more other word lines (e.g., word lines WL2 to WLY in FIG. 3A) different from the particular word line may be programmed and/or read reliably. A word line defect may cause memory cells associated with one or more word lines to not be programmed and/or read reliably (e.g., a word line defect associated with WL0 in FIG. 3A may also cause memory cells connected to WL1 to not be programmed and/or read reliably). In some cases, bias voltages and currents used during a programming operation or a read operation may be monitored to determine whether a word line defect is a benign defect. In one example, if the load current used for programming memory cells associated with a defective word line exceeds a particular threshold, then the word line defect may be deemed a non-benign word line defect. In some embodiments, word line defects caused by grown defects or aging of memory cells may be presumed to be benign if the neighboring word lines of a defective word line can be programmed and read reliably.

If the defects associated with the one or more defective word lines are not deemed benign, then step 806 is performed. In step 806, the memory block is added to a bad block list and effectively disabled. In some embodiments, a memory block including a number of word line defects that exceeds a threshold may be added to the bad block list. For example, if the number of word line defects exceeds 20% of the total number of word lines, then the memory block may be deemed a bad memory block and added to the bad block list. If the defects associated with the one or more defective word lines are deemed benign, then step 808 is performed. In step 808, the memory block is added to an incomplete block list. The incomplete block list may include memory blocks with word line defects that do not prevent the reading and/or writing of memory cells associated with non-defective word lines within the memory blocks. In step 810, the one or more defective word lines are added to a bad word lines list. The one or more defective word lines may be added to a bad word line list corresponding with the memory block. In one example, the incomplete memory block may be represented by a memory block address and the one or more defective word lines may be represented by one or more defective word line addresses. In one embodiment, the bad word lines list and the bad block list may be stored in a reserved memory partition accessible by firmware used by a NAND flash memory system.

In step 812, a first set of memory blocks associated with a free list is determined. The free list comprises a list of memory blocks that are free to be allocated as either MLC blocks, update blocks, or binary blocks. Each of the memory blocks associated with the free list may comprise defect-free memory blocks (e.g., as determined during the testing and sorting of memory die prior to customer shipment). In step 814, a first subset of the first set of memory blocks is allocated to an MLC block pool and a second subset of the first set of memory blocks is allocated to an update block pool. Each of the memory blocks within the MLC block pool may be used as an MLC block and each of the memory blocks within the update block pool may be used as an update block.

In step 816, a set of memory blocks associated with the incomplete block list is allocated to a binary cache pool (or a binary block pool used for non-caching purposes). In some embodiments, the binary cache pool may comprise memory blocks from the incomplete block list, as well as memory blocks from the free list (i.e., the binary cache pool may include both defect-free memory blocks and memory blocks including word line defects). In step 818, a memory die is configured based on the MLC block pool, the update block pool, and the binary cache pool. In one embodiment, the memory die may be configured to achieve a projected product lifetime by ensuring a minimum number of spare blocks and a minimum number of defect-free memory blocks allocated to the binary cache pool.

In step 820, data is written to a binary cache associated with the binary cache pool based on the bad word lines list. Memory system firmware may read the bad word lines list to generate one or more bad word line pointers, such as bad word line pointers 752-753 of FIG. 7A. Once the bad word lines within an incomplete memory block have been identified, the firmware layer may then identify one or more data fragments within the incomplete memory block that are available for storing data. The firmware (e.g., running within a memory controller, such as memory controller 105 of FIG. 1A) may sequentially program data into the one or more data fragments of the incomplete memory block. One embodiment of a process for writing data to an incomplete memory block is described later in reference to FIG. 8B.

Figure 8B:
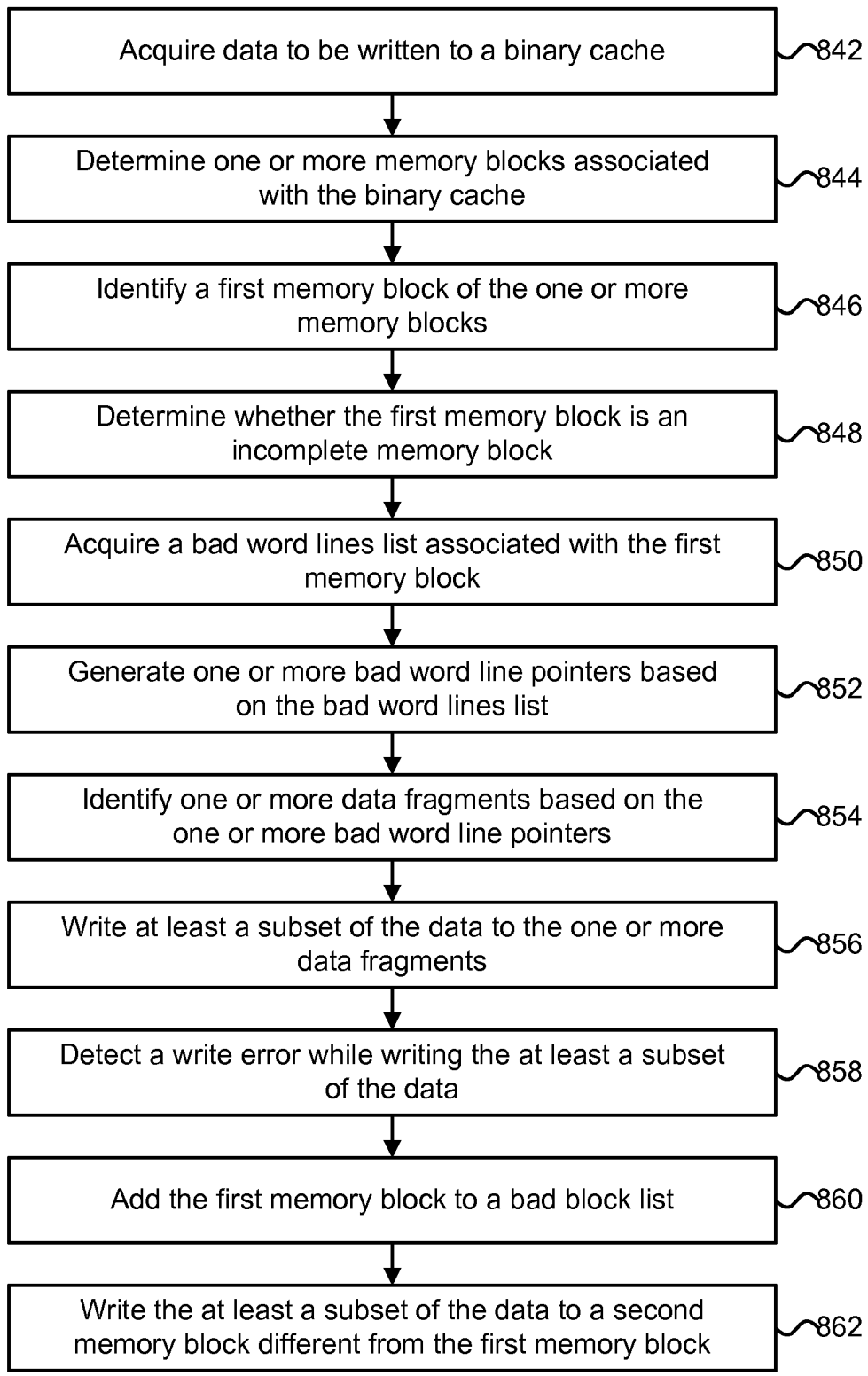
FIG. 8B is a flowchart describing one embodiment of a process for writing data to an incomplete memory block.

FIG. 8B is a flowchart describing one embodiment of a process for writing data to an incomplete memory block. The process described in FIG. 8B is one example of a process for implementing step 820 in FIG. 8A. In one embodiment, the process of FIG. 8B may be performed by a non-volatile storage system, such as non-volatile storage system 596 in FIG. 4.

In step 842, data to be written to a binary cache is acquired. In step 844, one or more memory blocks associated with the binary cache are determined. In step 846, a first memory block of the one or more memory blocks is identified. In step 848, it is determined whether the first memory block is an incomplete memory block. In step 850, a bad word lines list associated with the first memory block is acquired. The bad word lines list may include one or more word line addresses associated with bad word lines within the first memory block. In step 852, one or more bad word line pointers are generated based on the bad word lines list.

In step 854, one or more data fragments are identified based on the one or more bad word line pointers. In one embodiment, each data fragment within the one or more data fragments may correspond with at least a minimum number of word lines. In another embodiment, each data fragment of the one or more data fragments may be positioned between word line defects or between neighboring word lines of word line defects (i.e., when a word line defect occurs both the defective word line and its neighboring word lines may be removed as usable word lines within the incomplete memory block).

In step 856, at least a subset of the data is written to the one or more data fragments. In one embodiment, the at least a subset of the data is written in a sequential manner (or in a sequential word line order). In step 858, a write error is detected while writing the at least a subset of the data. The write error may correspond with a particular word line of the first memory block. The write error may be detected by determining the presence of one or more bit errors associated with the programming operation. In step 860, the first memory block is added to a bad block list and disabled as a usable memory block. In step 862, the at least a subset of the data is written to a second memory block different from the first memory block. The second memory block may correspond with a spare block.

In some embodiments, if a write error is detected while writing data to an incomplete memory block, then the memory system firmware may identify a defective word line within the incomplete memory block, add the defective word line to the list of bad word lines associated with the incomplete memory block, identify one or more new data fragments based on the updated list of bad word lines, and write the remaining data to the one or more new data fragments.

One embodiment of the disclosed technology includes identifying one or more defective word lines associated with a memory block, adding the one or more defective word lines to a bad word lines list, allocating the memory block to a binary block pool in response to the identifying one or more defective word lines, identifying one or more data fragments associated with the memory block based on the bad word lines list, and writing the data to the one or more data fragments.

One embodiment of the disclosed technology includes a non-volatile storage system including a memory block and one or more managing circuits in communication with the memory block. The memory block includes a plurality of NAND strings. The one or more managing circuits identify one or more defective word lines associated with the memory block, add the memory block to an incomplete block list, add the one or more defective word lines to a bad word lines list, allocate the memory block to a binary block pool in response to identifying the one or more defective word lines, identify one or more data fragments associated with the memory block based on the bad word lines list, and cause (or control) data to be written to the one or more data fragments in a sequential word line order subsequent to identifying the one or more data fragments.

One embodiment of the disclosed technology includes identifying one or more defective word lines associated with a memory block of a non-volatile storage system, allocating the memory block to a binary block pool in response to the identifying one or more defective word lines, determining one or more data fragments associated with the memory block based on one or more word line positions corresponding with the one or more defective word lines, and writing the data to the one or more data fragments in a sequential word line order. The method may further comprise performing a programming operation associated with the memory block and detecting a write error during the programming operation. The identifying one or more defective word lines may be performed in response to the detecting the write error. The allocating the memory block to the binary block pool may include moving (or reassigning) the memory block from an MLC block pool to the binary block pool. The method may further comprise allocating a defect-free memory block from the binary block pool to the MLC block pool in response to the allocating the memory block to the binary block pool.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
   identifying two or more defective word lines within a memory block, the two or more defective word lines correspond with initial defects that were formed during manufacturing of the memory block;
   detecting that the two or more defective word lines correspond with benign word line defects within the memory block in response to identifying the two or more defective word lines;
   allocating the memory block to a small fragment block pool in response to detecting that the two or more defective word lines correspond with benign word line defects within the memory block, each memory block allocated to the small fragment block pool includes at least one word line defect;
   acquiring data to be written to the memory block; and
   writing the data to the memory block subsequent to allocating the memory block to the small fragment block pool, the writing the data includes identifying one or more data fragments associated with the memory block, the identifying the one or more data fragments includes identifying a first defective word line of the two or more defective word lines and a second defective word line of the two or more defective word lines, the identifying the one or more data fragments includes identifying a set of contiguous word lines positioned between neighboring word lines of the first defective word line and the second defective word line, the writing the data includes writing the data to memory cells connected to the set of contiguous word lines.

2. The method of claim 1, further comprising:
   allocating a second memory block to a large fragment block pool to replace the memory block previously allocated to the large fragment block pool in response to identifying the two or more defective word lines within the memory block, the allocating the second memory block to the large fragment block pool reduces a size of a binary cache.

3. The method of claim 1, wherein:
   the identifying the two or more defective word lines includes writing one or more test patterns to each word line associated with the memory block.

4. The method of claim 1, wherein:
   the data is written to the one or more data fragments using one or more data fragment pointers.

5. The method of claim 1, further comprising:
   detecting a write error during the writing of the data; and
   adding the memory block to a bad block list in response to detecting the write error.

6. The method of claim 1, wherein:
   the memory block comprises a binary cache block; and
   the memory block includes a plurality of NAND strings.

7. The method of claim 1, wherein:
   the set of contiguous word lines includes a third word line that is adjacent to a fourth word line, the fourth word line is adjacent to the second defective word line, the set of contiguous word lines does not include the fourth word line; and
   the identifying the one or more data fragments includes identifying the one or more data fragments such that each data fragment of the one or more data fragments has at least a minimum number of word lines.

8. The method of claim 1, further comprising:
   performing a programming operation associated with the memory block; and
   detecting a write error during the programming operation, the identifying of the two or more defective word lines is performed in response to the detecting of the write error.

9. The method of claim 8, wherein:
   the allocating of the memory block to the small fragment block pool includes reassigning the memory block from a large fragment block pool to the small fragment block pool, each memory block within the large fragment block pool does not include a word line defect.

10. The method of claim 9, further comprising:
    allocating a defect-free memory block to the large fragment block pool in response to reassigning the memory block from the large fragment block pool to the small fragment block pool.

11. The method of claim 1, further comprising:
    adding the memory block to an incomplete block list in response to the determination that the two or more defective word lines are associated with benign word line defects.

12. A non-volatile storage system, comprising:
    a memory block, the memory block includes a plurality of NAND strings; and
    one or more managing circuits in communication with the memory block, the one or more managing circuits configured to identify two or more defective word lines within the memory block, the two or more defective word lines correspond with initial defects that were formed during manufacturing of the memory block, the one or more managing circuits configured to detect that the two or more defective word lines correspond with benign word line defects within the memory block and allocate the memory block to a small fragment block pool in response to identifying the two or more defective word lines, each memory block allocated to the small fragment block pool includes at least one word line defect, the one or more managing circuits configured to acquire data to be written to the memory block and identify one or more data fragments associated with the memory block, the one or more managing circuits configured to identify a first defective word line of the two or more defective word lines and a second defective word line of the two or more defective word lines, the one or more managing circuits configured to identify a set of contiguous word lines positioned between neighboring word lines of the first defective word line and the second defective word line the one or more managing circuits configured to cause the data to be written to memory cells connected to the set of contiguous word lines subsequent to allocating the memory block to the small fragment block pool.

13. The non-volatile storage system of claim 12, wherein:
    the one or more managing circuits configured to allocate a second memory block to a large fragment block pool to replace the memory block in the large fragment block pool in response to identifying the two or more defective word lines within the memory block, the allocating the second memory block to the large fragment block pool reduces a size of a binary cache.

14. The non-volatile storage system of claim 12, wherein:
    the one or more managing circuits configured to detect a write error while writing the data to the memory cells connected to the set of contiguous word lines, the one or more managing circuits configured to add the memory block to a bad block list in response to detecting the write error.

15. A method for writing data to a non-volatile storage system, comprising:
identifying two or more defective word lines associated with a memory block of the non-volatile storage system, the two or more defective word lines are caused by initial defects that are formed during fabrication of the memory block;
detecting that the two or more defective word lines correspond with benign word line defects within the memory block in response to identifying the two or more defective word lines;
allocating the memory block to a small fragment block pool in response to identifying the two or more defective word lines, each memory block allocated to the small fragment block pool includes at least one word line defect;
acquiring the data to be written to the memory block;
determining one or more data fragments associated with the memory block based on two or more word line positions corresponding with the two or more defective word lines, the determining one or more data fragments includes identifying a first defective word line of the two or more defective word lines and a second defective word line of the two or more defective word lines, the determining one or more data fragments includes identifying a set of contiguous word lines positioned between neighboring word lines of the first defective word line and the second defective word line; and
writing the data to memory cells connected to the set of contiguous word lines subsequent to allocating the memory block to the small fragment block pool.

16. The method of claim 15, wherein:
the identifying of the two or more defective word lines includes acquiring a bad word lines list from a reserved memory partition within the non-volatile storage system.

17. The method of claim 15, wherein:
the identifying of the two or more defective word lines includes writing one or more test patterns to each word line associated with the memory block.

18. The method of claim 15, further comprising:
detecting a write error during the writing of the data to the memory cells connected to the set of contiguous word lines; and
adding the memory block to a bad block list in response to the detecting of the write error.

19. The method of claim 15, wherein:
the memory block comprises a binary cache block; and
the memory block includes a plurality of NAND strings.

20. The method of claim 15, further comprising:
performing a programming operation associated with the memory block; and
detecting a write error during the programming operation, the identifying of the two or more defective word lines is performed in response to the detecting of the write error, the allocating of the memory block to the small fragment block pool includes reassigning the memory block from an MLC block pool to the small fragment block pool.

* * * * *